(12) United States Patent
Lee et al.

(10) Patent No.: US 8,241,968 B2
(45) Date of Patent: Aug. 14, 2012

(54) PRINTED CIRCUIT BOARD (PCB) INCLUDING A WIRE PATTERN, SEMICONDUCTOR PACKAGE INCLUDING THE PCB, ELECTRICAL AND ELECTRONIC APPARATUS INCLUDING THE SEMICONDUCTOR PACKAGE, METHOD OF FABRICATING THE PCB, AND METHOD OF FABRICATING THE SEMICONDUCTOR PACKAGE

(75) Inventors: Yong-kwan Lee, Hwaseong-si (KR);
Tae-sung Park, Cheonan-si (KR);
Won-keun Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/938,534

(22) Filed: Nov. 3, 2010

(65) Prior Publication Data
US 2011/0207266 A1 Aug. 25, 2011

(30) Foreign Application Priority Data
Feb. 25, 2010 (KR) ........................ 10-2010-0017197

(51) Int. Cl.
*H01L 21/00* (2006.01)
*H01K 3/00* (2006.01)
(52) U.S. Cl. .................. 438/126; 257/E21.502; 29/849
(58) Field of Classification Search .................. 438/106, 438/125, 126; 257/E21.499–E21.502; 29/829–832, 29/837, 846, 848–850
See application file for complete search history.

(56) References Cited

U.S. PATENT DOCUMENTS

| | | | | |
|---|---|---|---|---|
| 5,761,801 A | * | 6/1998 | Gebhardt et al. | 29/846 |
| 6,313,533 B1 | * | 11/2001 | Funaya et al. | 257/737 |
| 6,881,611 B1 | * | 4/2005 | Fukasawa et al. | 438/114 |
| 2006/0254050 A1 | * | 11/2006 | Fukuoka et al. | 29/830 |
| 2009/0121350 A1 | * | 5/2009 | Yamamoto et al. | 257/737 |
| 2011/0193222 A1 | * | 8/2011 | Usui et al. | 257/737 |

FOREIGN PATENT DOCUMENTS

| | | |
|---|---|---|
| JP | 3474936 | 9/2003 |
| KR | 10-0736636 | 7/2007 |
| KR | 10-0832651 | 5/2008 |

* cited by examiner

*Primary Examiner* — Leonard Chang
(74) *Attorney, Agent, or Firm* — Harness, Dickey & Pierce, P.L.C.

(57) ABSTRACT

A printed circuit board (PCB) includes a wire pattern that has a low processing cost and a high yield by simplifying the structure of the PCB and can increase the joining characteristics and reliability of minute bumps when a flip-chip bonding process is performed. The PCB includes a body resin layer having lower and upper surfaces, a wire pattern on or in one of the upper and lower surfaces of the body resin layer, at least one through-hole contact extending from the wire pattern through the body resin layer, and a solder resist on the upper and lower surfaces of the body resin layer, openings of the solder resist corresponding to at least one of a solder ball land and a bump land, the solder ball land and the bump land being configured to couple the PCB to a semiconductor chip. If the solder ball land is on the one-layer wire pattern, the bump land is on the through-hole contact, and if the bump land is on the wire pattern, the solder ball land is on the through-hole contact.

16 Claims, 11 Drawing Sheets

FIG. 9D

PRINTED CIRCUIT BOARD (PCB) INCLUDING A WIRE PATTERN, SEMICONDUCTOR PACKAGE INCLUDING THE PCB, ELECTRICAL AND ELECTRONIC APPARATUS INCLUDING THE SEMICONDUCTOR PACKAGE, METHOD OF FABRICATING THE PCB, AND METHOD OF FABRICATING THE SEMICONDUCTOR PACKAGE

CROSS-REFERENCE TO RELATED APPLICATIONS

This application claims priority to Korean Patent Application No. 10-2010-0017197, filed on Feb. 25, 2010, in the Korean Intellectual Property Office, the entire contents of which are incorporated herein by reference.

BACKGROUND

Inventive concepts relate to a semiconductor package, and more particularly, to a printed circuit board (PCB) including a one-layer wire pattern, a method of fabricating the PCB, a semiconductor package including the PCB, and a method of fabricating the semiconductor package.

Generally, a plurality of semiconductor chips are fabricated from a wafer by performing various semiconductor fabricating processes on the wafer. Afterwards, in order to mount each of the semiconductor chips on a PCB, the semiconductor chips are packaged by performing a packaging process on the wafer. A semiconductor package may include a semiconductor chip, a PCB on which the semiconductor chip is mounted, a bonding wire or a bump that electrically connects the semiconductor chip to the PCB, and a sealing member that seals the semiconductor chip.

Recently, since semiconductor chips are highly integrated, the size of semiconductor chips is reduced, and accordingly, semiconductor packages are also miniaturized, allowing for, for example, a chip scale package (CSP) or a wafer level package (WLP).

The cost of a PCB accounts for a high portion of the material costs of a semiconductor package, thereby increasing an overall cost of the semiconductor package.

SUMMARY

Inventive concepts provide a printed circuit board (PCB) including a one-layer wire pattern that has a low processing cost and a high yield by simplifying the structure of the PCB and can increase the joining characteristics and reliability of minute bumps when a flip-chip bonding process is performed, a semiconductor package including the PCB, an electrical and electronic apparatus including the semiconductor package, a method of fabricating the PCB, and a method of fabricating the semiconductor package.

According to an aspect of inventive concepts, there is provided a printed circuit board (PCB) including a wire pattern that has a low processing cost and a high yield by simplifying the structure of the PCB and can increase the joining characteristics and reliability of minute bumps when a flip-chip bonding process is performed. The PCB includes a body resin layer having lower and upper surfaces, a wire pattern on or in one of the upper and lower surfaces of the body resin layer, at least one through-hole contact extending from the wire pattern through the body resin layer, and a solder resist on the upper and lower surfaces of the body resin layer, openings of the solder resist corresponding to at least one of a solder ball land and a bump land, the solder ball land and the bump land being configured to couple the PCB to a semiconductor chip. If the solder ball land is on the one-layer wire pattern, the bump land is on the through-hole contact, and if the bump land is on the wire pattern, the solder ball land is on the through-hole contact.

When the one-layer wire pattern is on the lower surface of the body resin, the through-hole contact may protrude from the upper surface of the body resin. The one-layer wire pattern may be a buried type in which the one-layer wire pattern is formed in the body resin, or the one-layer wire pattern may be a normal type in which the one-layer wire pattern is formed outer side of the body resin.

According to an aspect of inventive concepts, there is provided a semiconductor package including a semiconductor chip, the printed circuit board (PCB), onto which the semiconductor chip is combined by using a wire bonding method or a flip-chip bonding method, and a sealing member that seals the semiconductor chip.

The sealing member filled in a space between the semiconductor chip and the PCB and the sealing member that covers outer sides of the semiconductor package may be identical since the semiconductor package is formed by using a molded underfill (MUF) process. The sealing member may include an external sealing resin that covers outer sides of the semiconductor chip and an underfill that is filled in a space between the semiconductor chip and the PCB.

According to an aspect of inventive concepts, there is provided an electrical and electronic apparatus including an input/output unit configured to receive and output data, an interface unit configured to receive and transmit the data, a memory unit configured to store the data, a control unit configured to control at least the input/output unit and the interface unit, and a bus configured to transmit the data between the input/output unit, the interface unit, and the control unit. At least one of the interface unit, the memory unit, and the control unit includes the semiconductor package.

According to an aspect of inventive concepts, there is provided a method of fabricating a printed circuit board (PCB) including forming at least one metal film, forming a wire pattern on the metal film, forming at least on through-hole contact on a portion of the wire pattern, forming a body resin layer on the at least one through-hole contact and the wire pattern, removing the at least one metal film, and coating a solder resist on upper and lower surfaces of the body resin layer.

The wire pattern and the through-hole contact may be formed by using a plating method. The forming of the body resin may include compressing the body resin onto the upper surface of through-hole contact and the wire pattern so that the through-hole contact passes through the body resin. The forming of the metal film may include forming two metal films on both surfaces of an adhesive layer to produce two PCBs. In this way, when two PCBs are produced, in the processes from the forming of the wire pattern to the forming of the body resin, an identical process may be performed on each of the metal films, and the method may further include removing the adhesive layer before removing the metal film.

According to an aspect of inventive concepts, there is provided a method of fabricating a semiconductor package including forming of the PCB, mounting a semiconductor chip on the PCB by using a wire bonding method or a flip-chip bonding method, and forming a sealing member to seal the semiconductor chip.

In the mounting of the semiconductor chip, when the semiconductor chip is mounted by using a flip-chip bonding method, the semiconductor chip may be combined with the through-hole contact by using a minute bump in the bump land.

According to another aspect of inventive concepts, there is provided a method of fabricating at least two printed circuit boards (PCB) including forming a first metal film on a first side of an adhesive film, forming a second metal film on a second side of the adhesive film, forming wire patterns on the first and second metal films, respectively, forming through-hole contacts on portions of the wire patterns, forming body resin layers on the first and second metal films, respectively, and removing the adhesive layer.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

The attached drawings for illustrating example embodiments of inventive concepts are referred to in order to gain a sufficient understanding of inventive concepts, the merits thereof, and objectives accomplished by the implementation of inventive concepts.

Hereinafter, inventive concepts will be described in detail by explaining example embodiments with reference to the attached drawings. In the drawings, lengths and sizes of layers and regions may be exaggerated for clarity. Like reference numerals in the drawings denote like elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the teen "and/or" includes any and all combinations of one or more of the associated listed items.

The terminology used herein is for the purpose of describing particular example embodiments only and is not intended to be limiting of inventive concepts. As used herein, the singular forms "a," "an" and "the" are intended to include the plural fauns as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
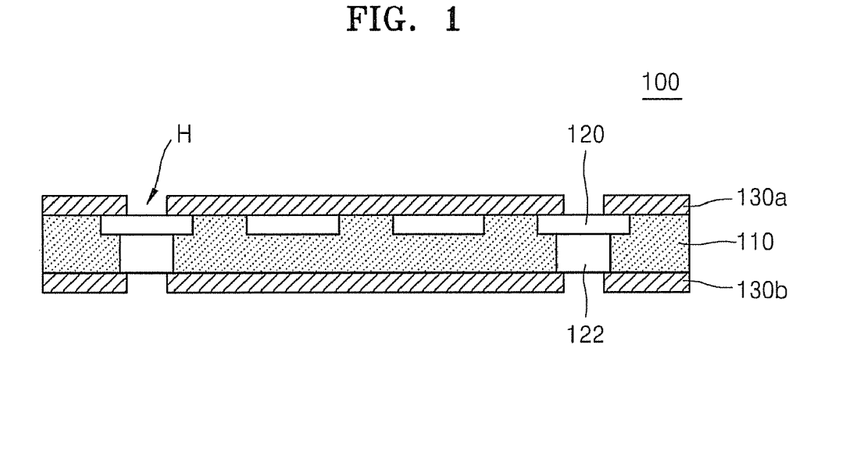
FIG. 1 is a cross-sectional view of a printed circuit board (PCB) including a one-layer wire pattern according to an example embodiment of inventive concepts.

FIG. 1 is a cross-sectional view of a printed circuit board (PCB) 100 including a one-layer wire pattern according to an example embodiment of inventive concepts.

Referring to FIG. 1, the PCB 100 includes a body resin 110, a wire pattern 120, a through-hole contact 122, and solder resists (STs) 130a and 130b.

The body resin 110 may be a prepreg resin that is a semi-hardened state resin formed by penetrating a thermosetting resin into a glass fiber. However, the body resin 110 is not limited to the prepreg resin, and may be formed by using any of various other resins. For example, the body resin 110 may be formed of a resin that includes a thermosetting epoxy resin, a thermal plasticity epoxy resin, or a filler.

The wire pattern 120 is faulted on one of an upper surface and a lower surface of the body resin 110. In this way, a structure in which a wire pattern is formed on a body unit, for example, on one surface of a body resin is referred to as a one-layer wire pattern. However, a structure in which wire patterns are formed on two surfaces of a body resin is referred to as a two-layer wire pattern. The PCB 100 according to an example embodiment of inventive concepts has a one-layer wire pattern in which the wire pattern 120 is formed on one surface of the body resin 110.

As shown in FIG. 1, the wire pattern 120 may be a buried type, that is, the wire pattern 120 is formed in the body resin 110. However, the wire pattern 120 according to an example embodiment of inventive concepts is not limited thereto, and may be a normal type, that is, the wire pattern 120 is formed on the body resin 110. As it will be described with reference to FIGS. 7A through 7F and/or with reference to FIGS. 8A through 8G, the wire pattern 120 may be formed having a shape on a metal thin film by using a plating method, and prepreg resin corresponding to the body resin 110 is combined with the wire pattern 120 by compressing the prepreg resin onto the wire pattern 120. However, the method of forming the wire pattern 120 is not limited thereto, for example, the wire pattern 120 may be formed by etching a metal thin film plated or deposited on an entire surface of the body resin 110 by using a photoresist (PR) pattern.

The through-hole contact 122 is formed on a selected pattern region of the wire pattern 120, and may be formed to extend through the body resin 110 from the selected pattern region of the wire pattern 120. That is, when the wire pattern 120 is formed on the upper surface of the body resin 110, the through-hole contact 122 may be formed to extend through the body resin 110 by extending from the wire pattern 120 so that a surface of the through-hole contact 122 is exposed on the lower surface of the body resin 110.

As shown in FIGS. 7A through 7F and/or in FIGS. 8A through 8G, after the wire pattern 120 is formed on a metal thin film and the through-hole contact 122 is formed on a portion of the wire pattern 120 by using a plating method, the PCB 100 may be realized by combining a resultant product including the wire pattern 120 and the through-hole contact 122 onto the prepreg resin corresponding to the body resin 110. However, the method of forming the through-hole contact 122 is not limited thereto. For example, after a via hole for forming the through-hole contact 122 is formed on a surface opposite to the surface of the body resin 110 on which the wire pattern 120 is formed by using a PR pattern mask, the through-hole contact 122 may be formed by filling the via hole with a metal material.

The solder resists 130a and 130b may be formed on the upper and lower surfaces of the body resin 110. A plurality of openings H are formed on regions of the solder resists 130a and 130b, and the openings H may be formed on a bump land to which a semiconductor chip is to be combined and on a solder ball land to which solder balls are to be combined in a subsequent process.

In the current example embodiment of inventive concepts, when the wire pattern 120 is formed on the upper surface of the body resin 110 to which the a semiconductor chip will be combined, a bump land may be formed on the upper surface of the body resin 110 on which the wire pattern 120 is formed, and the solder ball land may be formed on the lower surface of the body resin 110 on which the through-hole contact 122 is exposed. However, when the wire pattern 120 is formed on the lower surface of the body resin 110 to which the solder ball will be combined, the solder ball land may be formed on the lower surface of the body resin 110 on which the wire pattern 120 is formed, and the bump land is formed on the upper surface of the body resin 110 on which the through-hole contact 122 is exposed.

When the wire pattern 120 is formed on the lower surface of the body resin 110 to which the solder ball is to be combined and a semiconductor chip is combined on the upper surface of the body resin 110 by using a flip-chip bonding method, the through-hole contact 122 may be formed to protrude from the upper surface of the body resin 110. In this way, the through-hole contact 122 has a structure protruding from the upper surface of the body resin 110, and thus a bump joining characteristic between the through-hole contact 122 and a semiconductor chip is increased when the through-hole contact 122 is combined with the semiconductor chip by using a flip-chip bonding method, thereby increasing the reliability of the semiconductor package.

In the PCB 100 according to an example embodiment of inventive concepts, a wire pattern is formed on one of surfaces of a body resin and a through-hole contact is formed to an opposite surface by extending from the wire pattern through the body resin. Therefore, the PCB 100 having a simple structure can be realized. That is, in a conventional two-layer wire pattern in which wire patterns are formed on both surfaces of a PCB main body and metal contacts connect the wire patterns, the complicated fabrication processes result in a high PCB cost. In particular, the process for via holes for forming metal contacts has a high cost, and in connection with the reliability problem, yield is reduced.

However, the PCB 100 according to an example embodiment of inventive concepts has a one-layer wire pattern that has a relatively simple structure, and thus, has a simple fabrication process, and accordingly, the PCB fabrication cost can be reduced. As shown in FIGS. 7A through 7F and/or in FIGS. 8A through 8G, the PCB 100 can be readily fabricated, that is, the wire pattern 120 and the through-hole contact 122 are formed by using a plating method, and the PCB 100 is simply formed by forcedly combining the wire pattern 120 and the through-hole contact 122 to, for example, the prepreg corresponding to the body resin 110. Accordingly, there is no need to perform a process for forming via holes, thereby reducing the PCB fabrication cost and solving the low yield problem.

Figure 2:
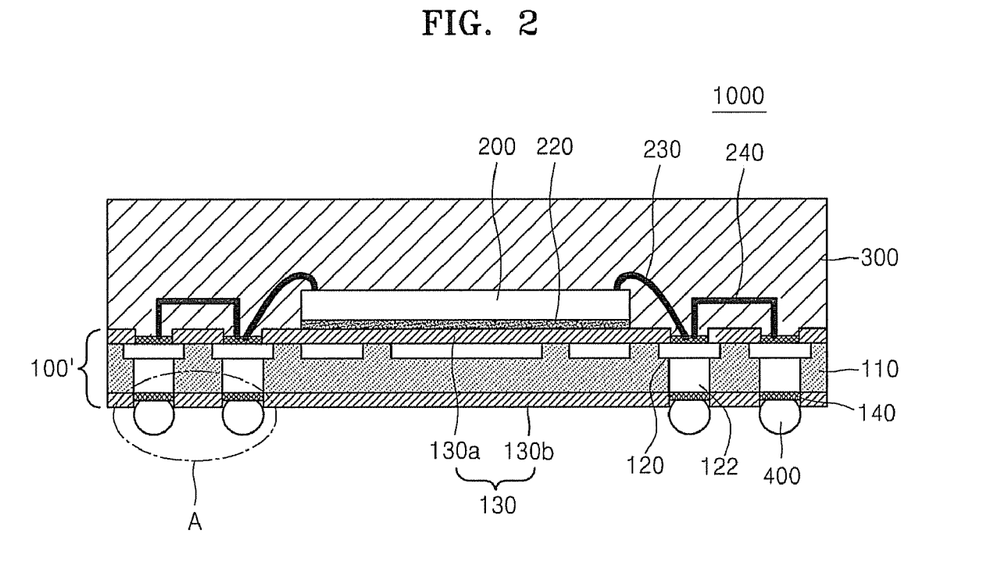
FIG. 2 is a cross-sectional view of a semiconductor package according to an example embodiment of inventive concepts.

FIG. 2 is a cross-sectional view of a semiconductor package 1000 according to an example embodiment of inventive concepts.

Referring to FIG. 2, the semiconductor package 1000 includes a PCB 100', a semiconductor chip 200, a sealing member 300, and solder balls 400.

The PCB 100' includes a one-layer wire pattern as described with reference to FIG. 1. That is, the PCB 100' includes the body resin 110, the wire pattern 120, the through-hole contact 122, and the solder resists 130a and 130b. The PCB 100' has a structure in which the wire pattern 120 is formed on the upper surface of the body resin 110 and the through-hole contact 122 extends through the body resin 110 from the wire pattern 120 and is exposed on the lower surface of the body resin 110. Of course, on the contrary, the PCB 100' may have a structure in which the wire pattern 120 is formed on the lower surface of the body resin 110 and the through-hole contact 122 may expose on the upper surface of the body resin 110 through the body resin 110.

The semiconductor chip 200 is combined with the PCB 100' by using an adhesive 220, and electronic devices formed in the semiconductor chip 200 are electrically connected to the wire pattern 120 of the PCB 100' through bonding wires 230 and connecting wires 240. The semiconductor chip 200 may be a memory chip such as a dynamic random access memory (DRAM) or a flash memory, or a logic chip that constitutes a controller.

Since the semiconductor chip 200 is connected to the PCB 100' via the bonding wires 230, a gold plated pad 140 for reducing contact resistance may be formed on an upper surface of the wire pattern 120 that is exposed by openings H.

The sealing member 300 protects the semiconductor chip 200 from the outside by sealing the semiconductor chip 200. The sealing member 300 may be formed of a thermosetting or thermoplastic epoxy resin.

The solder balls 400 are formed in a solder ball land of a lower surface of the PCB 100', and a surface of the through-hole contact 122 that extends from the wire pattern 120 through the body resin 110 is exposed in the solder ball land. The solder balls 400 can be combined with the exposed surface of the through-hole contact 122. Similar to the combining via the bonding wire 230, the gold plated pad 140 for reducing contact resistance may be formed on the exposed surface of the through-hole contact 122.

In the current example embodiment of inventive concepts, a semiconductor chip is mounted on the PCB 100' of FIG. 2 via a bonding wire, and thus, a semiconductor package can be readily realized.

Figure 3A:
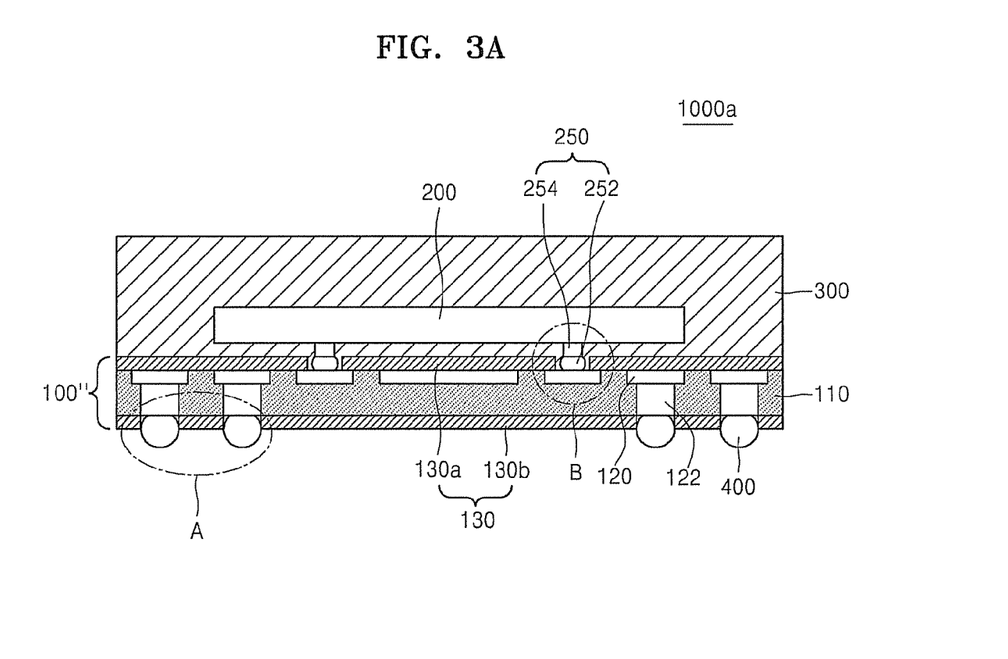
FIGS. 3A and 3B are cross-sectional views of a semiconductor package according to another example embodiment of inventive concepts.
Figure 3B:
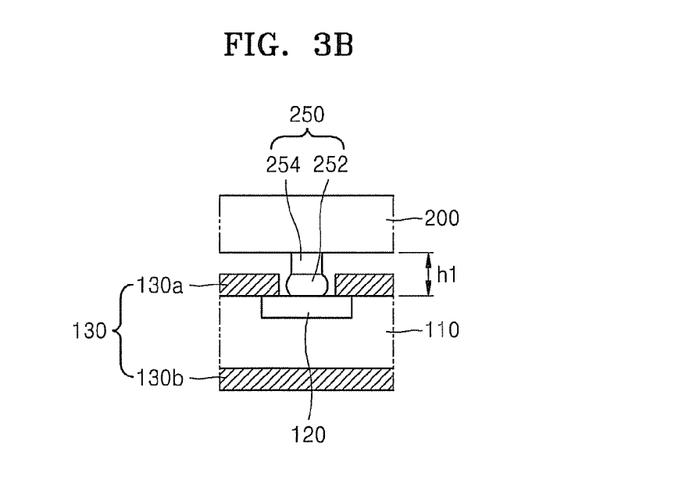

FIGS. 3A and 3B are cross-sectional views of a semiconductor package 1000a according to another example embodiment of inventive concepts.

Referring to FIG. 3A, the semiconductor package 1000a includes a PCB 100", the semiconductor chip 200, the sealing member 300, and the solder balls 400.

The PCB 100" includes a one-layer wire pattern described with reference to FIG. 1. However, unlike the semiconductor package 1000 of FIG. 2, the semiconductor chip 200 is combined with the PCB 100" via a flip-chip bonding method. Therefore, the wire pattern 120 suitable for flip-chip bonding is formed on the upper surface of the body resin 110. That is, in the semiconductor package 1000 of FIG. 2, portions of the wire pattern 120 on both sides of the PCB 100' are opened; however, in the semiconductor package 1000a, central portions of the wire pattern 120 are opened for flip-chip bonding. Generally, in the case of flip-chip bonding, a portion of the wire pattern 120 to be combined with a semiconductor chip through a bump 250 is referred to as a bump land B.

The semiconductor chip 200 is combined with the PCB 100" through a flip-chip bonding method as described above, that is, a main surface of the semiconductor chip 200 is combined with the PCB 100" through the bump 250. FIG. 3B shows a detailed structure in which the semiconductor chip 200 is combined with the PCB 100" through the bump 250.

The sealing member 300, like in the semiconductor package 1000 of FIG. 2, blocks and protects the semiconductor chip 200 from the outside, and may be formed of a thermosetting or thermoplastic epoxy resin. Like in the case of the semiconductor package 1000, in the current example embodiment, the sealing member 300 may be formed by using a molded underfill (MUF) process. Here, the MUF process refers to a process in which not only outer regions of the semiconductor chip 200 but also a space between the semiconductor chip 200 and the PCB 100" are filled with the sealing member 300 without additionally performing a filling process, by which the space between the semiconductor chip 200 and the PCB 100" is filled with an underfill. When the sealing member 300 is formed by using the MUF process, the sealing member 300 that covers the outer regions of the semiconductor chip 200 is formed of the same material as that of the sealing member 300 that is filled in the space between the semiconductor chip 200 and the PCB 100".

However, the sealing member 300 may be may be formed by using a conventional process instead of the MUF process. That is, after the space between the semiconductor chip 200 and the PCB 100" is filled with an underfill, the sealing member 300 may be formed by performing a process of covering the outer regions of the semiconductor chip 200 by using an external sealing resin. Here, the underfill that fills the space between the semiconductor chip 200 and the PCB 100" may be the same as the external sealing resin that covers the outer regions of the semiconductor chip 200, or may not be the same.

As shown in the semiconductor package 1000 of FIG. 2, the solder balls 400 are formed in solder ball lands A on a lower surface of the PCB 100". That is, the solder balls 400 are combined with the exposed surface of the through-hole contact 122 that extends from the wire pattern 120 through the body resin 110. In FIG. 3B, an Au plated pad is not included; however, an Au plated pad for reducing contact resistance may also be formed on the exposed surface of the through-hole contact 122.

FIG. 3B shows a detailed structure in which the semiconductor chip 200 is combined with the PCB 100 through the bump 250. Here, the bump 250 may include a minute bump 252 and a bump pad 254. The bump pad 254 may have a structure in which the bump pad 254 is combined with a pad of the semiconductor chip 200 or an under bump metal (UBM) on a semiconductor chip pad. The bump 250 is combined with the wire pattern 120 through a bump land B formed on the wire pattern 120.

In the semiconductor package 1000a according to an example embodiment of inventive concepts, as shown in FIG. 3B, a combined height of the semiconductor chip 200 and the PCB 100" may be equal to a height h1 of the bump 250, that is, the sum of heights of the minute bump 252 and the bump pad 254. The height of the semiconductor package 1000a having the above structure depends on the height of the bump 250. In the semiconductor package 1000a having the structure described above, since the wire pattern 120 is formed on the upper surface of the body resin 110 as a buried structure, the bump land structure may have a "buried+solder mask defined (SMD)" structure.

Figure 4A:
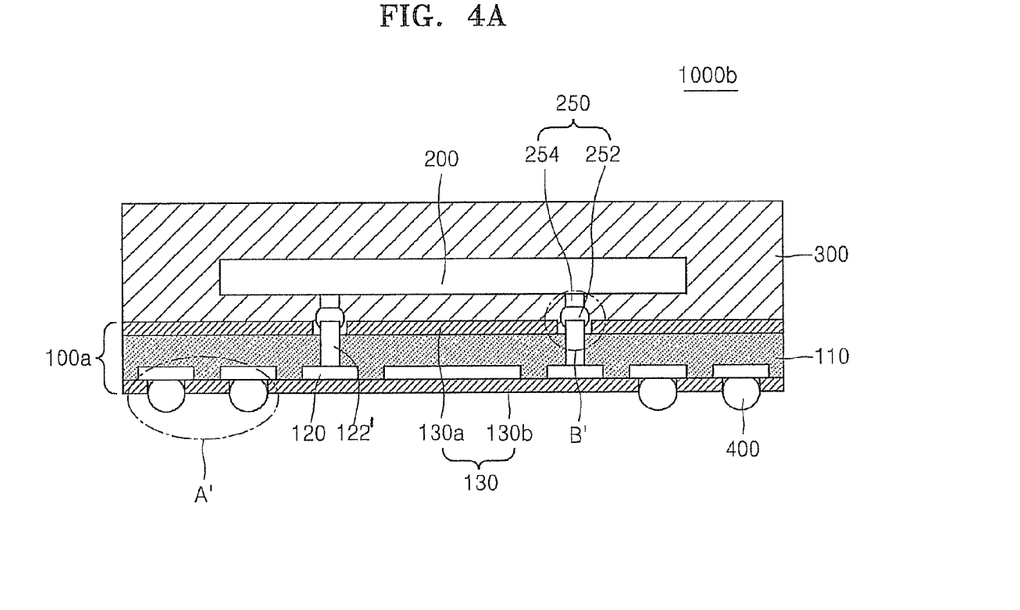
FIGS. 4A and 4B are cross-sectional views of a semiconductor package according to another example embodiment of inventive concepts.
Figure 4B:
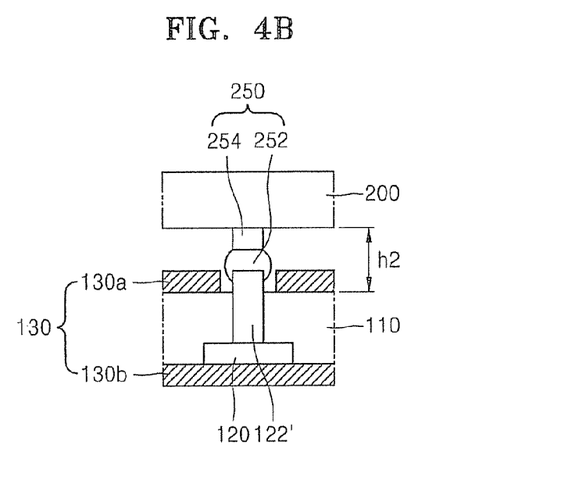

FIGS. 4A and 4B are cross-sectional views of a semiconductor package 1000b according to another example embodiment of inventive concepts.

Referring to FIG. 4A, the semiconductor package 1000b includes a PCB 100a, the semiconductor chip 200, the sealing member 300, and the solder balls 400.

The PCB 100a has a structure different from that of the PCB 100" of FIG. 3A. That is, in the PCB 100a, the wire pattern 120 is formed on the lower surface of the body resin 110, and thus, a solder ball land A' to which a solder ball is combined is formed on the wire pattern 120. Also, a bump land B' to be combined with the semiconductor chip 200 is formed on a through-hole contact 122' that extends from the wire pattern 120 through the body resin 110.

In this way, when the bump land B' is formed on the through-hole contact 122, the through-hole contact 122' can be formed to protrude from the upper surface of the body resin 110 by increasing the height of the through-hole contact 122', as shown in FIG. 4A. When the through-hole contact 122' protrudes from the upper surface of the body resin 110, the joining characteristic to the bump 250 can be increased. Elements that are not described with respect to the semiconductor package 1000b are the same as or similar to the elements of the semiconductor packages 1000a of FIG. 3A, and thus, the descriptions thereof will not be repeated.

Referring to FIG. 4B, the semiconductor package 1000b according to the current example embodiment has a structure in which the through-hole contact 122' protrudes from the upper surface of the body resin 110. Therefore, the joining characteristic of the bump 250 can be increased when the semiconductor chip 200 is combined with the PCB 100a by using a flip-chip bonding method. Also, as shown in FIG. 4B, the combining height of the semiconductor chip 200 and the PCB 100a may be a height h2 equal to the sum of the thickness of the bump 250 and a protruded height of the through-hole contact 122', and the height h2 may be greater than the height h1 of FIG. 3B. Accordingly, an underfill process can be readily performed, and a space between the semiconductor chip 200 and the PCB 100a can be sufficiently filled in the MUF process, that is, the MUF processability can be increased, thereby increasing the reliability of the semiconductor package 1000b.

Here, the through-hole contact 122' protrudes to the same height as an upper solder resist 130a, and thus, the bump land structure can have a non-solder mask defined (NSMD) structure. Therefore, even when the flip-chip bonding method is applied to fine pitch bumps having a very fine size, the semiconductor package 1000b can be realized without problems.

Figure 5:
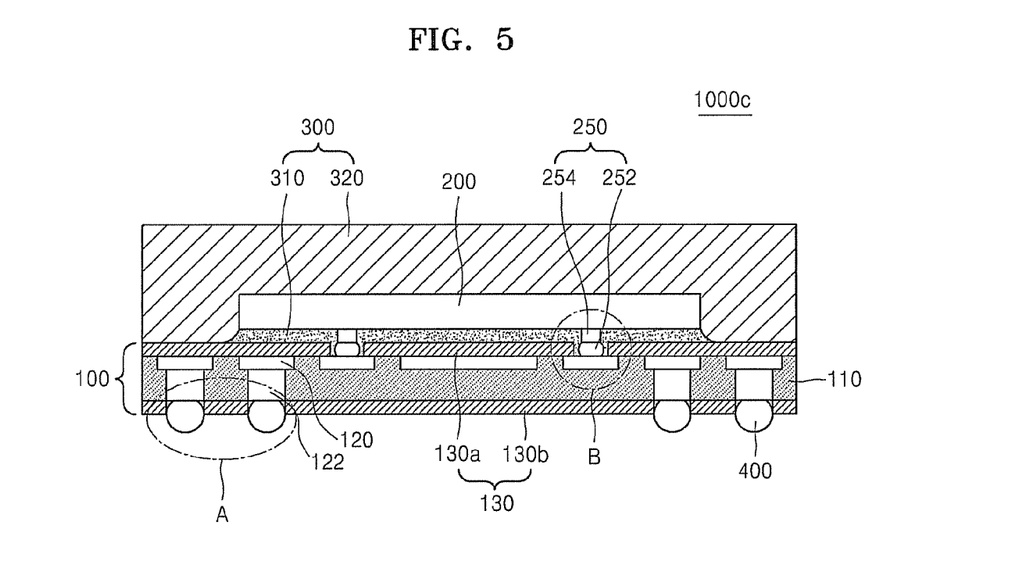
FIG. 5 is a cross-sectional view of a semiconductor package according to another example embodiment of inventive concepts.

FIG. 5 is a cross-sectional view of a semiconductor package 1000c according to another example embodiment of inventive concepts.

Referring to FIG. 5, the semiconductor package 1000c has a structure that is basically the same as that of the semiconductor package 1000a of FIG. 3A. As described with reference to the semiconductor package 1000a of FIG. 3A, the sealing member 300 is formed by an underfill 310 and an external sealing member 320 formed separately from each other. Generally, the underfill 310 and the external sealing member 320 are formed of materials different from each other; however, they may instead be formed of the same material.

In this way, the sealing member 300 including the underfill 310 and the external sealing member 320 can be applied to not only the structure of the semiconductor package 1000a of FIG. 3A but also to the structure of the semiconductor package 1000b of FIG. 4A.

Figure 6:
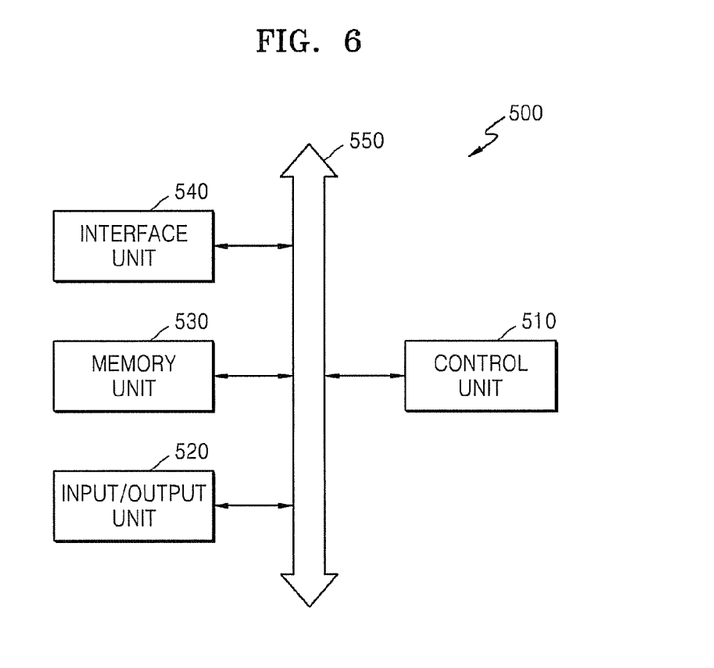
FIG. 6 is a block diagram of an electrical and electronic apparatus according to an example embodiment of inventive concepts.

FIG. 6 is a block diagram of an electrical and electronic apparatus 500 according to an example embodiment of inventive concepts.

Referring to FIG. 6, the electrical and electronic apparatus 500 includes a control unit 510, an input/output unit 520, a memory unit 530, an interface unit 540, and a bus 550. The control unit 510, the input/output unit 520, the memory unit 530, and the interface unit 540 are connected to each other through the bus 550.

The control unit 510 may include at least one of, for example, a microprocessor, a digital signal processor, and a microcontroller.

The input/output unit 520 may receive data or signals from outside of the electrical and electronic apparatus 500 or may output data or signals to out of the electrical and electronic apparatus 500. The input/output unit 520 may include a keyboard, a keypad, or a display device. The memory unit 530 may store an order instructed by the control unit 510, and may include various memories such as a DRAM and a flash memory. The interface unit 540 may exchange data by communicating with a network.

In the electrical and electronic apparatus 500 according to the current example embodiment, at least one of the control unit 510, the memory unit 530, and the interface unit 540 may be formed of one of the semiconductor packages 1000, 1000a, 1000b, and 1000c. That is, each of the semiconductor packages 1000, 1000a, 1000b, and 1000c of FIGS. 2 through 5, respectively, may be a semiconductor package for a memory chip or a logic chip that constitutes at least one of the control unit 510, the memory unit 530, and the interface unit 540.

The electrical and electronic apparatus 500 according to the current example embodiment can be used for mobile systems, for example, PDAs, portable computers, web tablets, wireless phones, mobile telephones, digital music generators, memory cards, and data transmission or receivers.

FIGS. 7A through 7F are cross-sectional views showing a method of fabricating a PCB according to an example embodiment of inventive concepts.

Figure 7A:
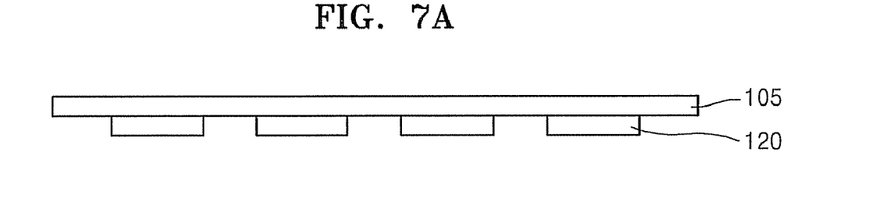
FIGS. 7A through 7F are cross-sectional views showing a method of fabricating a PCB according to an example embodiment of inventive concepts.

Referring to FIG. 7A, a wire pattern 120 is formed on a metal thin film 105 that functions as a carrier. The metal thin film 105 may be a copper thin film or a copper plated thin film. The metal thin film 105 can also be formed of a different metal from the metal thin film 105.

The wire pattern 120 may be formed having a desired pattern through plating by using a mask. However, the wire pattern 120 can also be formed by using a method different from the plating method. The wire pattern 120 may be formed of the same material used to form the metal thin film 105, for example, copper, but is not limited thereto. The wire pattern 120 may also be formed of a metal different from the metal used to form the metal thin film 105.

Figure 7B:
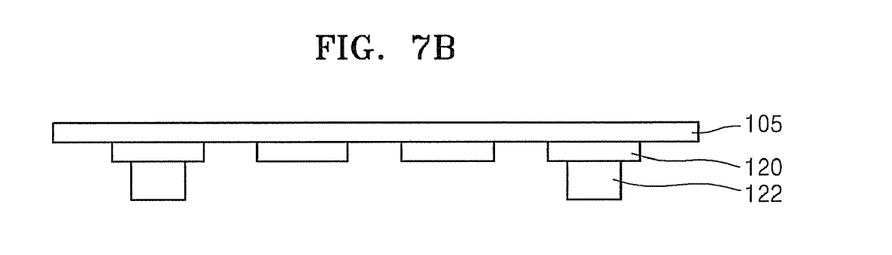

Referring to FIG. 7B, through-hole contacts 122 are formed on selected portions of the wire pattern 120. The through-hole contact 122 may be formed to have an appropriate height in consideration of the thickness of a body resin that is to be combined with the through-hole contact 122 in a subsequent process. For example, like the semiconductor package 1000a of FIG. 3A, when the upper surface of the through-hole contact 122 is used as a solder ball land, the through-hole contact 122 may be formed so that the combined height of the wire pattern 120 and the through-hole contact 122 is similar to the thickness of the body resin 110. Also, like the semiconductor package 1000b of FIG. 4a, when the upper surface of the through-hole contact 122 is used as a bump land, since the through-hole contact 122 may protrude from the body resin 110, the through-hole contact 122 may be formed so that the combined height of the wire pattern 120 and the body resin 110 is greater than the thickness of the body resin 110.

The through-hole contact 122 may be formed of the same material used to form the wire pattern 120, that is, copper, by using a plating method. However, the method and the material are not limited to copper and the plating method, that is, the through-hole contact 122 may be formed by using other materials and methods.

Figure 7C:
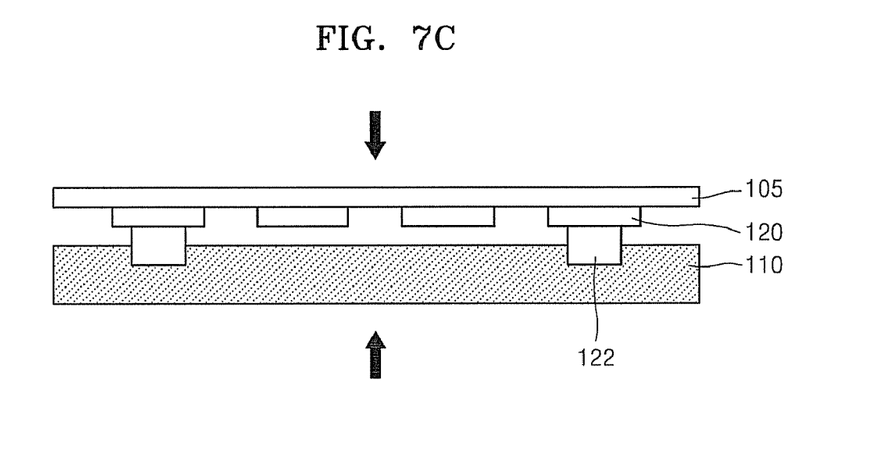
Figure 7D:
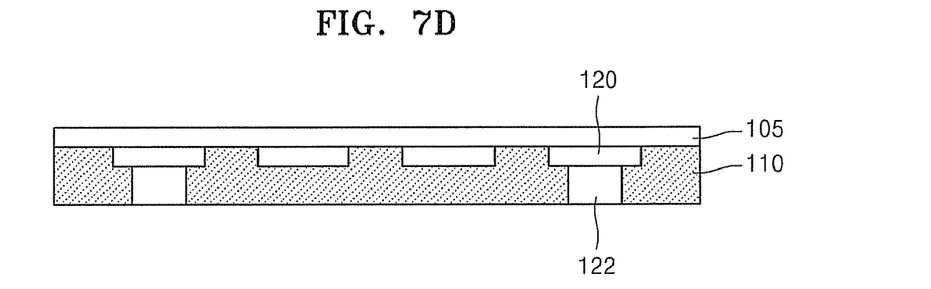

Referring to FIGS. 7C and 7D, a resultant product is formed by forcedly compressing the through-hole contact 122 onto the body resin 110 until the through-hole contact 122 passes through the body resin 110. In FIG. 7D, both the wire pattern 120 and the through-hole contact 122 are inserted into the body resin 110; however, in some cases, only the through-hole contact 122 may be inserted into the body resin 110. When only the through-hole contact 122 is inserted into the body resin 110, only the height of the through-hole contact 122 is to be considered with respect to the thickness of the body resin 110, and also, spaces between the wire patterns 120 may be pre-filled with a material to have the same thickness as the wire pattern 120.

As described above, when the wire pattern 120 is formed within the body resin 110 by inserting the wire pattern 120 into the body resin 110, the wire pattern 120 is a buried type wire pattern, and when the wire pattern 120 is formed on a surface of the body resin 110 without being inserted into the body resin 110, the wire pattern 120 is a normal type wire pattern.

Here, the body resin 110 may be formed of a prepreg resin or any of various other resins. For example, the body resin 110 may be formed of a resin containing a thermosetting or thermoplastic epoxy resin or a filler.

Figure 7E:
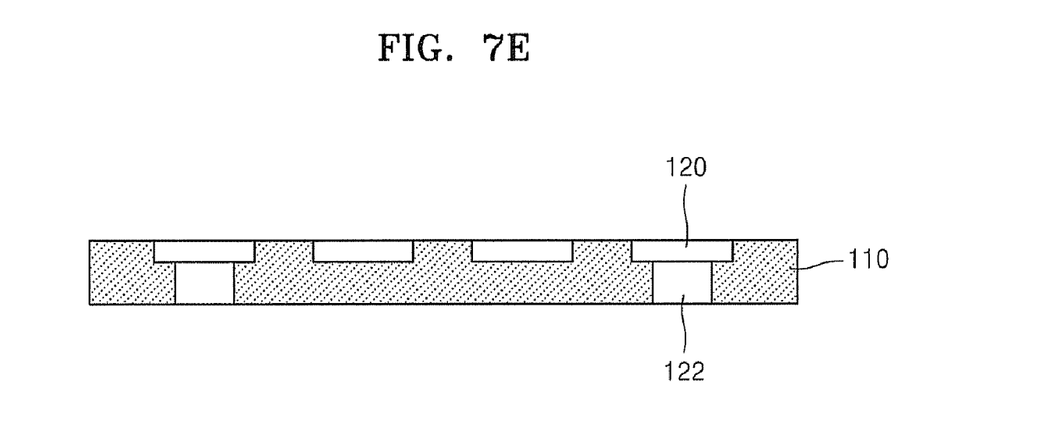

Referring to FIG. 7E, when the body resin 110 is completely combined with the wire pattern 120 and the through-hole contact 122, the metal thin film 105 on the body resin 110 is removed by etching.

Figure 7F:
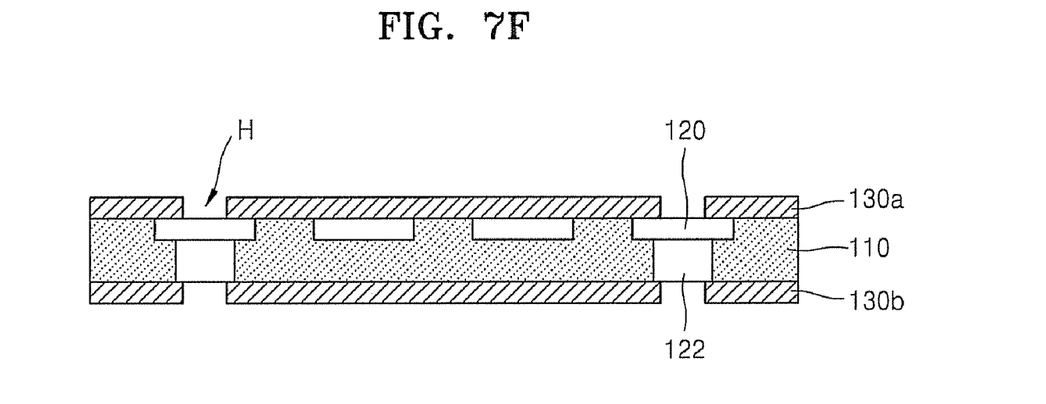

Referring to FIG. 7F, after the metal thin film 105 is removed, solder resists 130a and 130b are formed to entirely cover upper and lower surfaces of the body resin 110. Afterwards, openings H that expose surfaces of the wire pattern 120 and the through-hole contact 122 are formed on locations of the body resin 110 where solder ball lands and bump lands will be formed. If necessary, Au plated pads may be formed on the surfaces of the wire pattern 120 or the surfaces of the through-hole contact 122 exposed by the openings H.

As described above, one of the solder ball land and the bump land may be formed on the wire pattern 120, and the remaining one may be formed on the through-hole contact 122. In particularly, when the through-hole contact 122' protrudes from the upper surface of the body resin 110 as shown in FIG. 4A, the solder ball land may be formed on the wire pattern 120 and the bump land may be formed on the through-hole contact 122'.

FIGS. 8A through 8G are cross-sectional views showing a method of fabricating a PCB according to another example embodiment of inventive concepts. The method demonstrates fabrication of two PCBs in a single process.

Figure 8A:
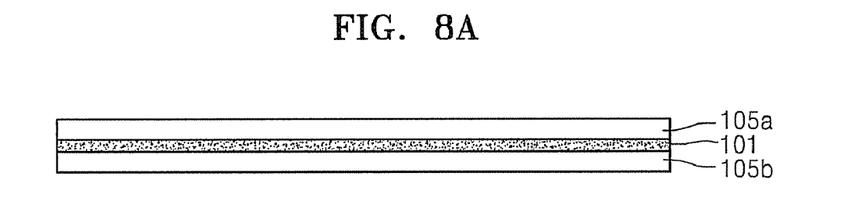
FIGS. 8A through 8G are cross-sectional views showing a method of fabricating a PCB according to another example embodiment of inventive concepts.

Referring to FIG. 8A, metal thin films 105a and 105b as carriers are formed on two surfaces of an adhesive layer 101. As described above, the metal thin films 105a and 105b may be a copper thin film or a copper plated thin film, but are not limited thereto.

Figure 8B:
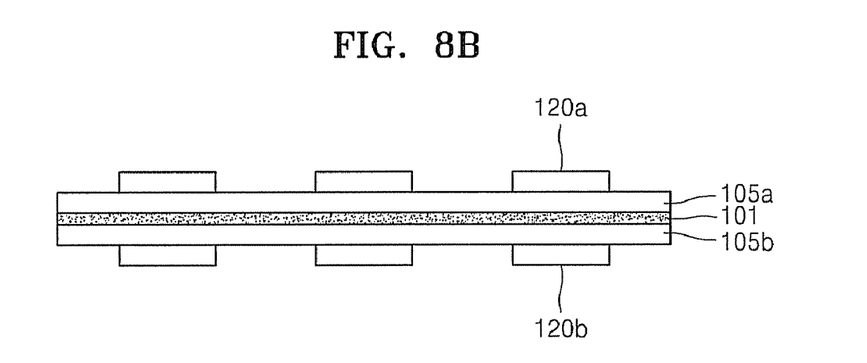

Referring to FIG. 8B, wire patterns 120a and 120b are respectively formed on the metal thin films 105a and 105b. The wire patterns 120a and 120b may be formed of the same material as the metal thin films 105a and 105b, for example, copper, by using a plating method; however, the material and the method are not limited thereto.

Figure 8C:
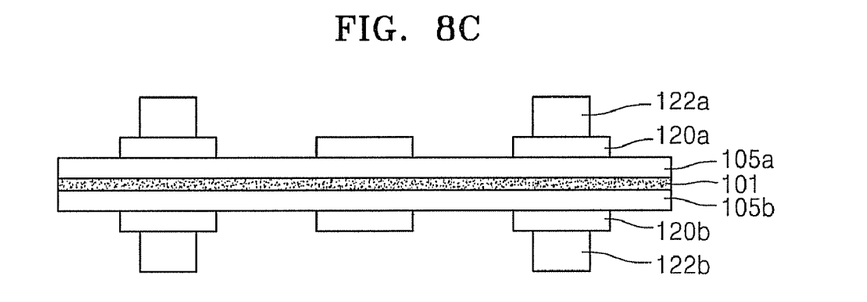

Referring to FIG. 8C, through-hole contacts 122a and 122b are respectively formed on portions of the wire patterns 120a and 120b. The through-hole contacts 122a and 122b may be formed of the same material used to form the wire pattern 120 by using a plating method; however, the material and method are not limited thereto. Also, the height of the through-hole contacts 122a and 122b may be appropriately controlled in consideration of the thickness of the body resin 110.

Figure 8D:
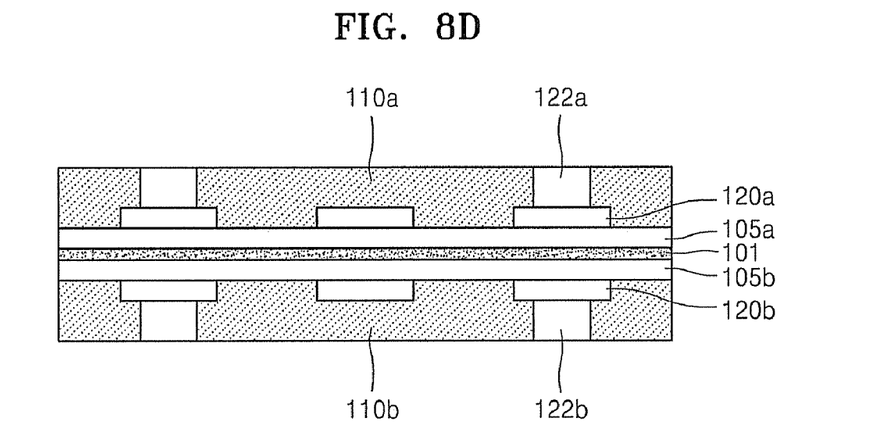

Referring to FIG. 8D, the through-hole contacts 122a and 122b are respectively combined with body resins 110a and 110b, for example, prepreg resins, by forcedly compressing both the through-hole contacts 122a and 122b into the body resins 110a and 110b. According to whether the wire patterns 120a and 120b are inserted into the body resins 110a and 110b, the wire patterns 120a and 120b may be a buried type wire pattern or a normal type wire pattern. The body resins 110a and 110b may be formed of prepreg resin, but are not limited thereto.

Figure 8E:
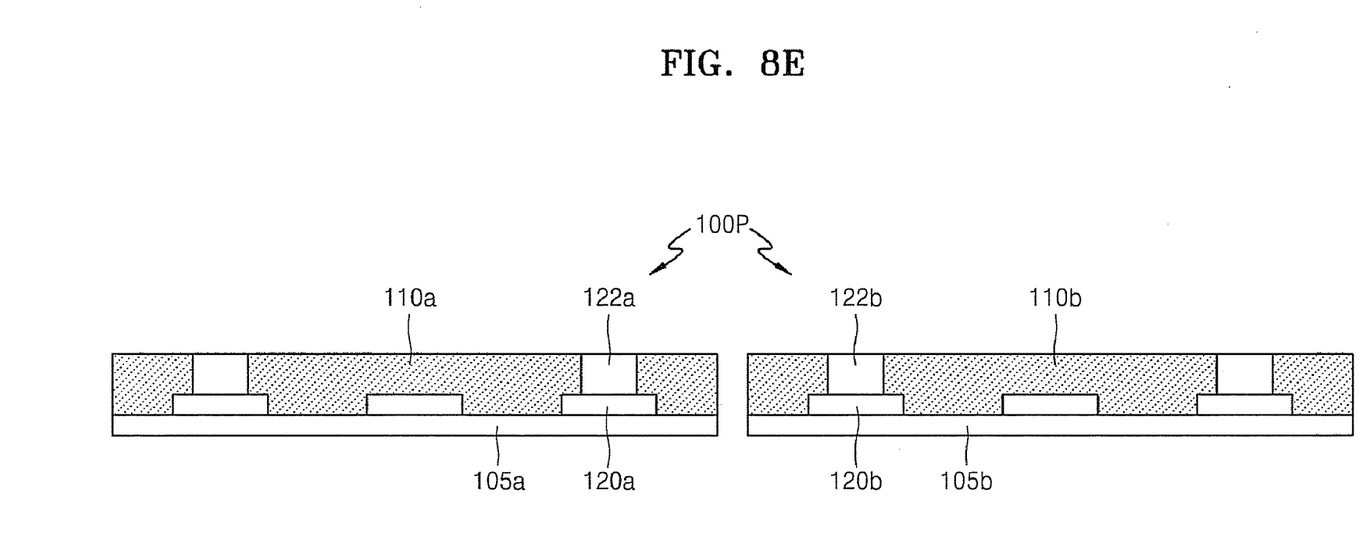

Referring to FIG. 8E, after the body resins 110a and 110b are combined with the wire patterns 120a and 120b and the through-hole contacts 122a and 122b, two pre-PCBs 100p, before forming solder resists, are produced by removing the adhesive layer 101. In subsequent processes, the processes for the two pre-PCBs 100p are identical, and thus, hereinafter, the process with respect to one of the two pre-PCBs 100p will be described.

Figure 8F:
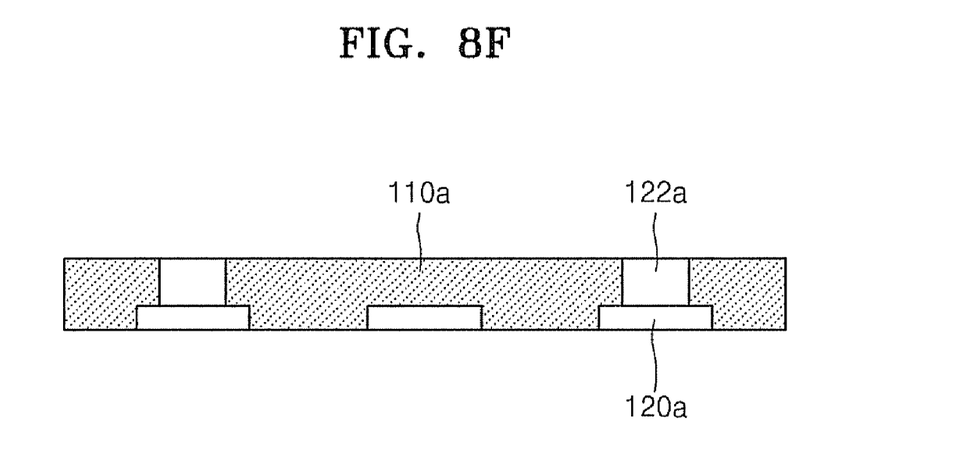

Referring to FIG. 8F, the metal thin film 105a on a lower surface of the pre-PCB 100p is removed by etching.

Figure 8G:
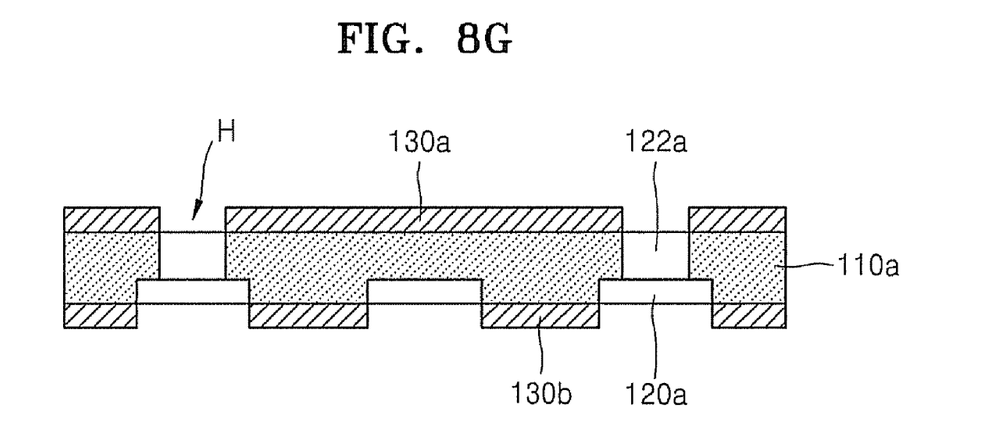

Referring to FIG. 8G, after the metal thin film 105a is removed, solder resists 130a and 130b are &Lined to entirely cover upper and lower surfaces of the body resin 110a. Afterwards, openings H that expose surfaces of the wire pattern 120a and the through-hole contact 122a are formed on positions where solder ball lands and bump lands will be located.

The method of fabricating a PCB according to an example embodiment of inventive concepts can fabricate two PCBs in a single process, thereby reducing process cost and increasing productivity.

FIGS. 9A through 9D are cross-sectional views showing a method of fabricating a semiconductor package according to an example embodiment of inventive concepts.

Figure 9A:
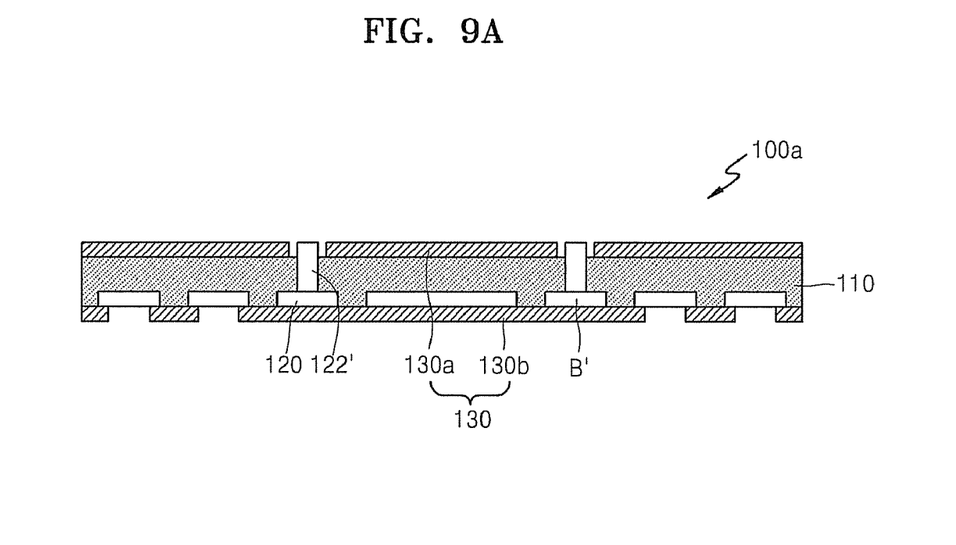
FIGS. 9A through 9D are cross-sectional views showing a method of fabricating a semiconductor package according to an example embodiment of inventive concepts.

Referring to FIG. 9A, a PCB 100a including a one-layer wire pattern is formed. The PCB 100a can be fabricated through the processes described with reference to FIGS. 7A through 7F or FIGS. 8A through 8G. In the current example embodiment, the through-hole contact 122' protrudes from an upper surface of the body resin 110 so as to form the semiconductor package 1000b shown in FIG. 4A; however, when a semiconductor package like the semiconductor package 1000a of FIG. 3A is formed, the through-hole contact 122 may not protrude from the upper surface of the body resin 110.

Figure 9B:
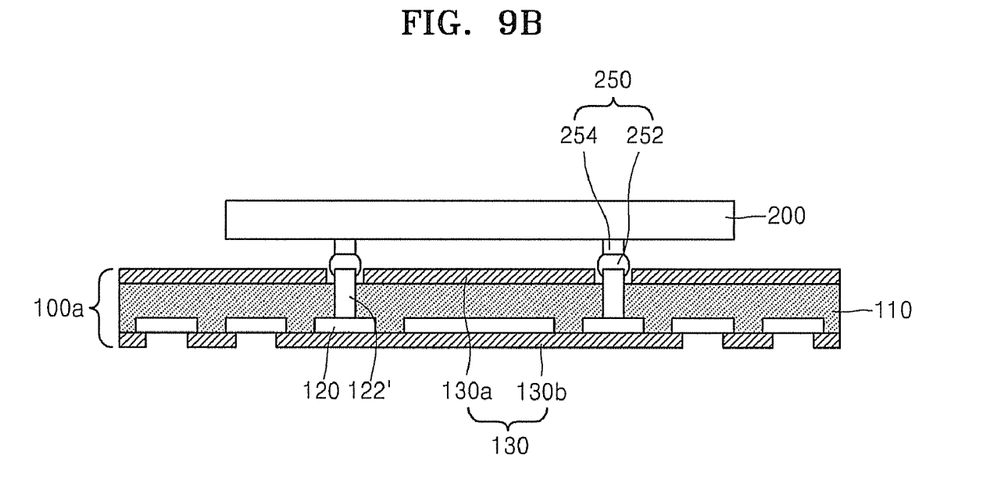

Referring to FIG. 9B, a semiconductor chip 200 is combined with the PCB 100a by using a flip-chip bonding method, that is, a bump 250. In the current example embodiment, a flip-chip bonding method is used. However, the semiconductor chip 200 can also be combined with the PCB 100a by using a wire bonding method as shown in FIG. 2. When the semiconductor chip 200 is combined with the PCB 100a by using a wire bonding method, the wire pattern 120 may be formed on an upper surface of the body resin 110 and openings that expose the wire pattern 120 may be formed on outer-upper surfaces of two sides of the PCB 100a. Also, an Au plated pad for reducing contact resistance with a bonding wire may be formed on exposed surfaces of the wire pattern 120.

Figure 9C:
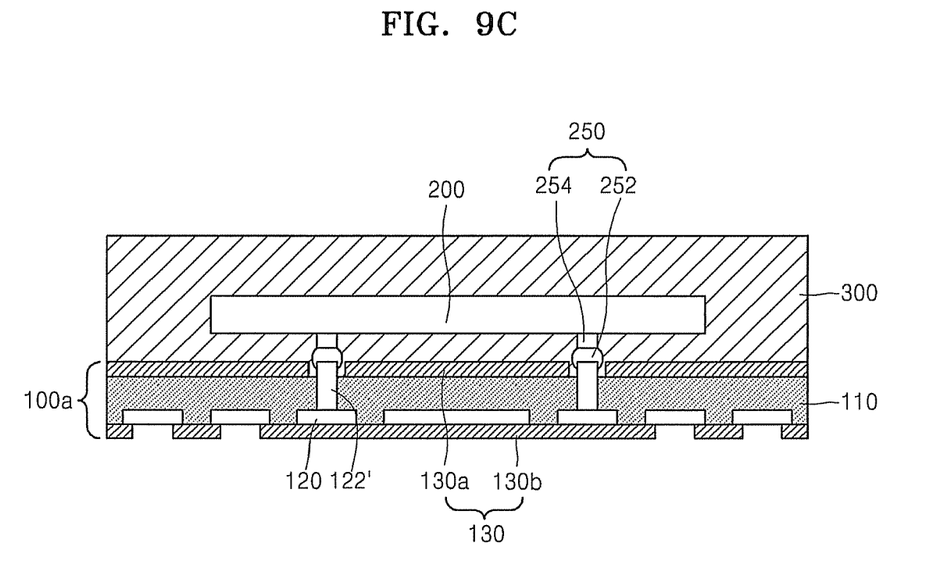

Referring to FIG. 9C, after the semiconductor chip 200 is combined with the PCB 100a, the semiconductor chip 200 is sealed by using a sealing member 300. As described above, the sealing member 300 may be formed by using a MUF process, but is not limited thereto. For example, after an underfill is formed in advance, which is a conventional way, the semiconductor chip 200 may be sealed by using an external sealing resin.

Figure 9D:
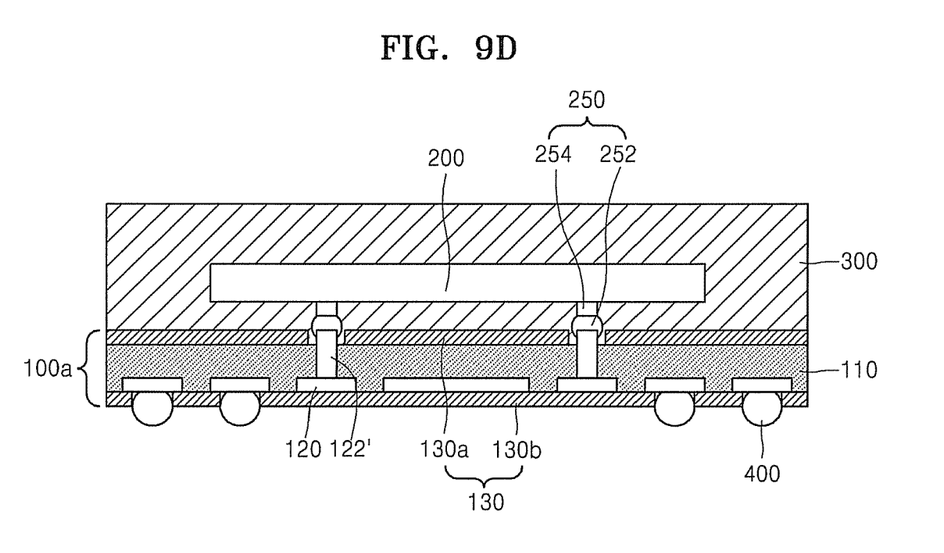

Referring to FIG. 9D, after the sealing member 300 is formed, solder balls 400 are formed on a lower side of the PCB 100a. The solder balls 400 may be used in a subsequent process in which a semiconductor package is mounted on a large external substrate, such as a system board.

While inventive concepts have been particularly shown and described with reference to example embodiments thereof, it will be understood that various changes in fowl and details may be made therein without departing from the spirit and scope of the following claims.

What is claimed is:

1. A method of fabricating a printed circuit board (PCB) comprising:
    forming at least one metal film; forming a wire pattern on the at least one metal film;
    forming at least one through-hole contact on a portion of the wire pattern;
    forming a body resin layer on the at least one through-hole contact and the wire pattern;
    removing the at least one metal film; and
    coating a solder resist on upper and lower surfaces of the body resin layer;
    wherein the forming the at least one metal film includes forming two metal films on two surfaces of an adhesive layer.

2. The method of claim 1, wherein the forming the wire pattern and the forming the at least one through-hole contact include plating.

3. The method of claim 1, wherein the forming the body resin layer includes compressing the body resin layer onto an upper surface of the at least one through-hole contact and the wire pattern so that the at least one through-hole contact passes through the body resin layer.

4. The method of claim 1, further comprising:
    forming a solder ball land or a bump land in the wire pattern, wherein, if the solder ball land is formed in the wire pattern, an exposed surface of the at least one through-hole contact corresponds to the bump land, and if the bump land is formed in the wire pattern, the exposed surface of the at least one through-hole contact corresponds to the solder ball land.

5. The method of claim 4, wherein the forming the at least one through-hole contact forms the at least one through-hole contact to protrude from the body resin layer if the exposed surface of the at least one through-hole contact corresponds to the bump land.

6. The method of claim 1, wherein the coating the solder resist includes forming openings corresponding to solder ball lands or bump lands.

7. The method of claim 1, wherein the body resin layer includes a prepreg resin, a thermosetting epoxy resin, a thermoplastic epoxy resin, or a filler.

8. A method of fabricating a semiconductor package comprising:
  forming a printed circuit board (PCB), the forming the PCB including,
    forming at least one metal film,
    forming a wire pattern on the at least one metal film,
    forming at least one through-hole contact on a portion of the wire pattern,
    forming a body resin layer on the at least one through-hole contact and the wire pattern, and
    removing the at least one metal film; and
  coating a solder resist on upper and lower surfaces of the body resin layer;
  mounting a semiconductor chip on the PCB by wire bonding or flip-chip bonding; and forming a sealing member to seal the semiconductor chip;
  wherein the forming the at least one metal film includes forming two metal films on two surfaces of an adhesive layer.

9. The method of claim 8, wherein the forming the sealing member includes a molded underfill (MUF) process.

10. The method of claim 8, wherein the forming the sealing member includes,
  filling an underfill in a space between the semiconductor chip and the PCB; and
  forming an external sealing resin that seals outer sides of the semiconductor chip.

11. The method of claim 8, wherein the mounting the semiconductor chip includes combining the semiconductor chip with the at least one through-hole contact using a bump land if the semiconductor chip is mounted by the flip-chip bonding method.

12. The method of claim 8, further comprising:
  forming solder balls in solder ball lands after the forming the sealing member.

13. The method of claim 8, wherein the forming the wire pattern and the forming the at least one through-hole contact include plating.

14. The method of claim 8, wherein the forming the body resin layer includes compressing the body resin layer onto an upper surface of the at least one through-hole contact and the wire pattern so that the at least one through-hole contact passes through the body resin layer.

15. A method of fabricating at least two printed circuit boards (PCB) comprising:
  forming a first metal film on a first side of an adhesive film;
  forming a second metal film on a second side of the adhesive film;
  forming wire patterns on the first and second metal films, respectively;
  forming through-hole contacts on portions of the wire patterns;
  forming body resin layers on the first and second metal films, respectively;
  removing the adhesive layer; and
  removing the first and second metal films after removing the adhesive film.

16. The method of claim 15, further comprising:
  coating a solder resist on upper and lower surfaces of the body resin layers.

* * * * *